United States Patent [19]

Funatsu

[11] Patent Number: 5,011,061

[45] Date of Patent: Apr. 30, 1991

[54] WIRE BONDING DEVICE

[75] Inventor: Kazuyuki Funatsu, Fukuoka, Japan

[73] Assignee: Matsushita Electric Industrial Co., Ltd., Osaka, Japan

[21] Appl. No.: 381,249

[22] Filed: Jul. 18, 1989

[30] Foreign Application Priority Data

Jul. 22, 1988 [JP] Japan .................. 63-184309

[51] Int. Cl.⁵ ...................... H01L 21/60; B23K 20/00
[52] U.S. Cl. .................................... 228/1.1; 228/4.5;
                                             228/8; 228/10
[58] Field of Search ............... 228/110, 1.1, 4.5, 102,
                                    228/8, 9, 10; 219/56.21

[56] References Cited

U.S. PATENT DOCUMENTS

| 4,266,710 | 5/1981  | Bilane et al.   | 228/1.1 |
| 4,571,688 | 2/1986  | Kashihara et al.| 228/1.1 |
| 4,631,685 | 12/1986 | Peter           | 228/1.1 |
| 4,789,095 | 12/1988 | Kobayashi       | 228/1.1 |

FOREIGN PATENT DOCUMENTS

| 57863  | 5/1979 | Japan   | 228/1.1 |
| 7441   | 1/1981 | Japan   | 228/4.5 |
| 36839  | 2/1982 | Japan   | 228/4.5 |
| 462682 | 3/1975 | U.S.S.R.| 228/1.1 |

Primary Examiner—Sam Heinrich
Attorney, Agent, or Firm—Stevens, Davis, Miller & Mosher

[57] ABSTRACT

A wire bonding device is disclosed. The device has a capillary which causes a wire to make press-contact to a bonding face, a driving motor for raising and lowering the capillary, a storage, means for storing data on a capillary height when making contact to the bonding face or a capillary height with respect to a reference height when making contact to the bonding face, and a control unit for effecting control so that the capillary is lowered at a predetermined velocity down to a height corresponding to the data stored therein and is further lowered at a lower velocity than the predetermined velocity till impinging on the bonding face, the control means further functioning such that the storage means stores the data on the capillary height when impinging on the bonding face at a first bonding cycle.

6 Claims, 3 Drawing Sheets

WIRE BONDING DEVICE

BACKGROUND OF THE INVENTION

1. Field of the Invention

The present invention relates to a wire bonding device used for manufacturing a semiconductor integrated circuit device.

2. Description of the Prior Art

One typical arrangement of a conventional hybrid integrated circuit device among semiconductor integrated circuit devices is that a semiconductor chip is mounted on a ceramic substrate or a glass reinforced epoxy substrate, and the semiconductor chip is connected to a wiring part of the substrate by wire-bonding the substrate wiring part to the semiconductor chip.

The description will hereinafter deal with steps of wire bonding. To start with, a metal wire is inserted through a hollow capillary, and a tip of the metal wire is slightly protruded from the capillary top. The protrusion of the metal wire from the top of the capillary is so fused by electric discharge as to assume a ball-like configuration. The ball-like tip of the metal wire, which is protruded from the capillary top, pushes this capillary top against a bonding face of the semiconductor chip. Ultrasonic vibrations are applied to the capillary, while the capillary top remains pushed against the bonding face of the semiconductor chip. Thereupon, the protruded metal wire from the capillary top is fused by frictional heat with the semiconductor chip and is thereby joined thereto. In this state, the capillary is temporarily raised and moved above the wiring part of the substrate. Subsequently, the capillary is depressed on the wiring part of the substrate, and the capillary again undergoes the ultrasonic vibrations. The protruded metal wire from the capillary top is immediately fused by the frictional heat with the substrate wiring part, thus connecting the semiconductor chip to the substrate wiring part. Next, the capillary is raised from the substrate wiring part, and the protruded metal wire from the capillary top is cut off. Then, the protruded metal wire from the capillary top is fused by the electric discharge so that the tip of the metal wire assumes the ball-like shape. The semiconductor chip is connected to the substrate wiring part by repeating the above-described operations.

During such operations, a load caused when the capillary pushes the metal wire against the bonding face exerts a large influence on a bonding quality. For instance, if the pushing load is excessively large, the ball-shaped tip of the metal wire is greatly deformed, with the result that the tip thereof contacts the contiguous portion and is short-circuited in some cases. The bonding face of the semiconductor chip is probably defaced. Whereas if the pushing load is too small, the metal wire often comes off the bonding part because of insufficient bonding.

On the other hand, if a warp can be seen in the substrate or there is variance of thickness thereof, when the capillary is pushed against the bonding face after moving it up and down at a given distance, there is produced wide variations in the pushing load of the capillary.

Under such circumstances, in the prior art wire bonding device, the capillary temporarily ceases to descend while being in contact with the bonding face, and thereafter the capillary is pushed against the bonding face by a predetermined force.

There arises, however, a problem inherent in the conventional wire bonding device, wherein it takes much time to effect a series of operations, because the capillary temporarily stops lowering while contacting the bonding face and is then pushed against the bonding face by the predetermined force.

SUMMARY OF THE INVENTION

It is a primary object of the present invention to provide a wire bonding device capable of performing the operations at a high velocity and permitting a bonding head to steer clear of a substrate.

To this end, according to one aspect of the invention, there is provided a wire bonding device comprising: a capillary for causing a wire to press-contact a bonding face; a driving motor for driving the capillary to raise and lower the capillary; a storage means for storing data indicating a height of the capillary when the capillary comes in contact with the bonding face; and a control unit for effecting control processes so that the capillary is lowered at a predetermined velocity down to a height corresponding to the data stored in the storage means, and subsequently the capillary continues to be lowered at a lower velocity than the predetermined velocity till the capillary impinges on the bonding face.

According to another aspect of the invention, there is provided a wire bonding device comprising: a capillary for causing a wire to press-contact a bonding face; a driving motor for driving the capillary to raise and lower the capillary; a storage means for storing data indicating a height of the capillary with respect to a reference height when the capillary contacts the bonding face; and a control unit for effecting control processes so that the capillary is lowered at a predetermined velocity down to a height corresponding to the data stored in the storage means, and subsequently the capillary continues to be lowered at a lower velocity than the predetermined velocity till the capillary impinges upon the bonding face.

The capillary is fitted through a spring to a capillary support body.

A cam and a pair of arms, extending from the capillary support body for seizing the cam, cooperate to drive the capillary so as to raise and lower the capillary.

According to still another aspect of the invention, there is provided a wire bonding device comprising: a capillary for causing a wire to press-contact a bonding face, a driving motor for driving the capillary to raise and lower the capillary; a storage means for storing data indicating a height of the capillary with respect to a reference height; and a control unit for effecting control processes so that the capillary is lowered at a predetermined velocity down to a height corresponding to the data stored in the storage means, the capillary subsequently continues to be lowered at a lower velocity than the predetermined velocity till the capillary impinges upon the bonding face, and the storage means stores the data on the capillary height when the capillary impinges upon the bonding face at a first bonding cycle.

The wire bonding device according to the present invention comprises the storage means for storing the data indicating the capillary heights with respect to the reference height when the capillary, which causes its wire to press-contact the bonding face, comes in contact with this bonding face, and the control unit for effecting control processes so that the capillary is lowered at the high velocity down to the height corresponding to the data stored in the storage means and is subsequently lowered at the low velocity till it impinges upon the bonding face. Based on this construction, once the capillary comes in contact with the bonding face, the data indicating the capillary contacting height is stored in the storage means. At the next bonding cycle, the capillary descends at the high velocity down to the height corresponding to the data stored in the storage means, and thereafter continues to be lowered at the low velocity till it impinges upon the bonding face. Even if a large warp is caused in the substrate on which the bonding process is effected, the device of the invention exhibits such effects that the capillary is allowed to descend near the bonding face at the high velocity, and the operations can be carried out at the high speed.

BRIEF DESCRIPTION OF THE DRAWINGS

Other objects and features of the invention will become apparent from the following discussion taken in conjunction with the accompanying drawings, in which.

DESCRIPTION OF THE PREFERRED EMBODIMENT

One embodiment of a wire bonding device according to the present invention will hereinafter be described with reference to the accompanying drawings.

Figure 1:
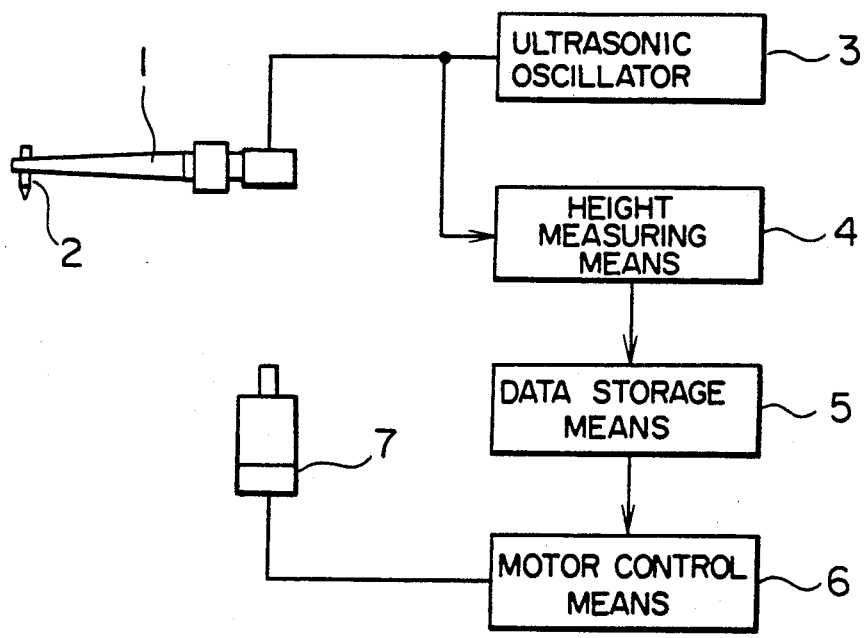
FIG. 1 is a functional block diagram illustrating a wire bonding device in one embodiment of the present invention.
Figure 2:
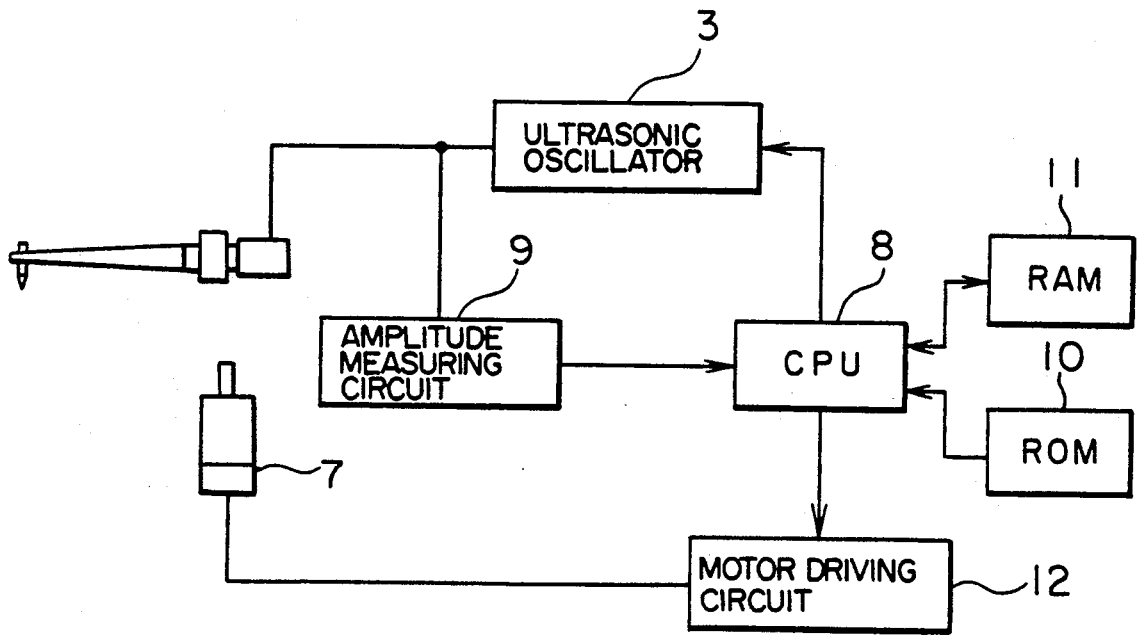
FIG. 2 is a block diagram depicting a construction of an electric circuit thereof.
Figure 4:
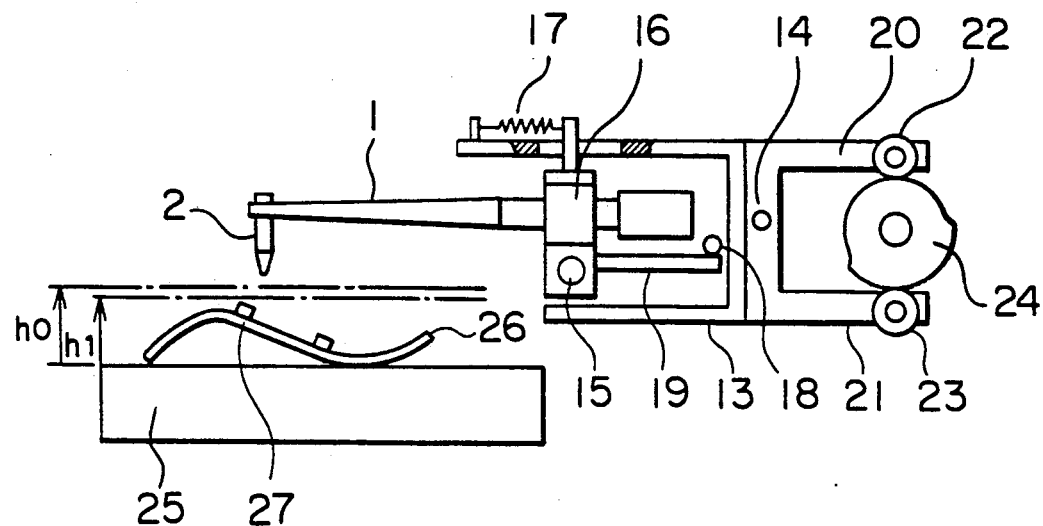
FIG. 4 is a side view depicting the principal portion thereof.
Figure 5:
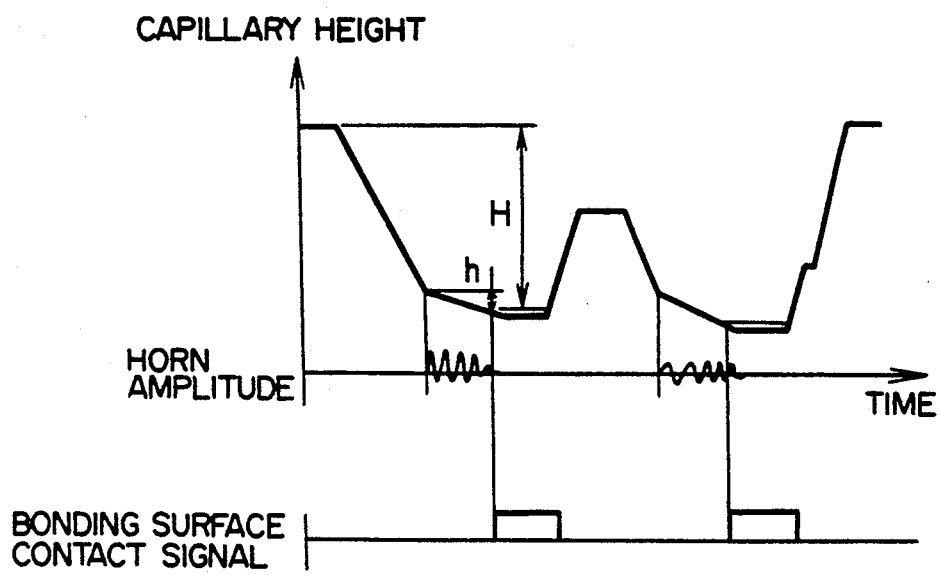
FIG. 5 is a characteristic diagram of a capillary's height versus a time.

Turning first to FIG. 1, there is illustrated a functional block diagram of a construction of the wire bonding device in one embodiment of the invention. Referring again to FIG. 1, an ultrasonic horn generally designated at 1 includes a capillary 2 at the top thereof. The hollow capillary 2 is formed with a through-hole for a metal wire. The numeral 3 denotes an ultrasonic oscillator connected to an ultrasonic vibrator of the ultrasonic horn 1. A height measuring means 4 is intended to measure a height of the capillary 2 with respect to a reference position of the top par thereof. The numeral 5 represents a data storage means for storing output data of the height measuring means 4. A motor control means 6 functions to control a driving motor 7 in accordance with the data stored in the data storage means 5. The driving motor 7 linked to the capillary 2 serves to move the capillary 2 in the up-and-down directions. FIG. 2 is a block diagram showing an electric circuit of the wire bonding device according to the present invention. The numeral 8 stands for a microcomputer (hereinafter referred to as CPU). Indicated at 9 is an amplitude detecting circuit, connected to an input port of the CPU 8, for outputting a signal showing that an amplitude of the capillary 2 decreases under a predetermined value. The numeral 10 designates a read-only memory (ROM) for storing data indicating operating procedures of the CPU 8. The numeral 11 represents a random access memory (RAM) for storing data to be temporarily saved during the operation of the CPU 8. A motor driving circuit 12 acts to transmit a control signal to the driving motor 7 in response to an output signal of the CPU 8. FIG. 4 is a side view depicting the principal portion of the wire bonding device of the invention. Designated at 13 is a capillary support body rotatably fitted through the intermediary of a shaft 14 to a device body (not illustrated). Rotatably supported on the bonding head support body 13 is a horn support member 16 for supporting the ultrasonic horn 1 by means of a shaft 15. The numeral 17 denotes a pre-load spring for biasing the horn support member 16 in a left rotating direction of FIG. 4 to depress the capillary 2 downwards. The numeral 18 represents a rotation restricting protrusion protruded from the bonding head support body 13; 19 a bar projecting from the horn support member 16; 20 and 21 arms projecting from the bonding head support body 13 and being provided with rollers at their tops, respectively; 24 a cam linked to the driving motor 7; 25 a substrate retaining board; 26 a substrate; and 27 a semiconductor chip loaded on the substrate 25. The substrate has a warp which is exaggeratively illustrated for facilitating the understanding in FIG. 4.

Figure 3:
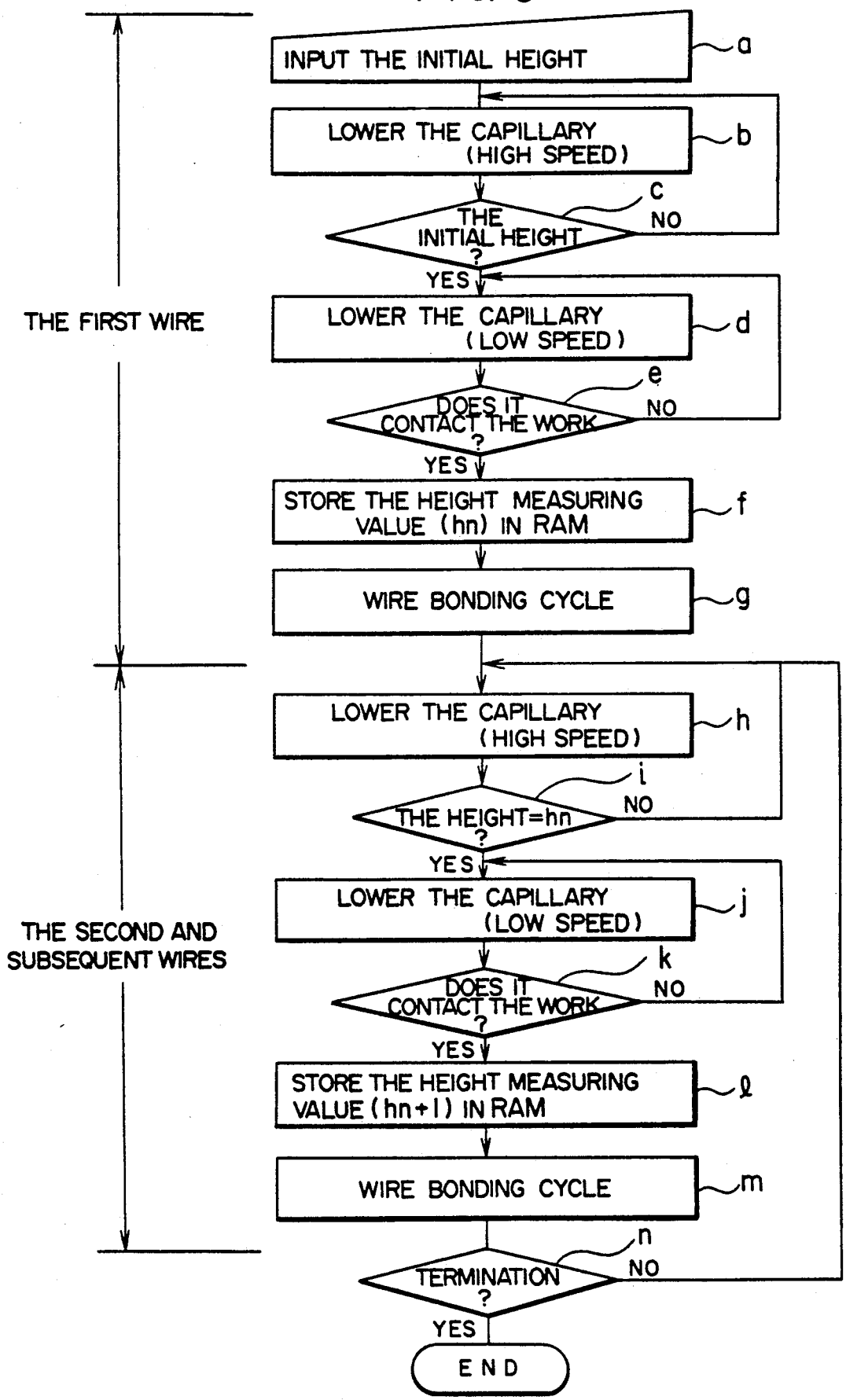
FIG. 3 is a flow chart showing the operations thereof.

The operation of the thus constructed wire bonding device of the invention will hereinafter be described referring to a flow chart of FIG. 3.

A first step a is to input the data indicating an initial height h0 of the capillary with respect to a reference position. In steps h and c, a signal is transmitted to the driving motor 7 which is in turn rotated at a high speed. The bonding head support body 13 is forced to rotate about the shaft 14 by means of the cam 24. As a result, the capillary 2 is lowered till it reaches the initial height h0. At a step d, the driving motor 7 receives a signal and is thereby rotated at a low speed. Subsequently, the capillary 2 is lowered at the low velocity. A step e is to check an output signal of the amplitude detecting circuit 9. If an amplitude of the capillary 2 is a predetermined value or under, the top of the capillary 2 is, it may be considered, in contact with a bonding face. Immediately when the top of the capillary 2 comes in contact with the bonding face, at a step f, the RAM 11 stores the data indicating a height h1 at which the capillary top contacts the bonding face. A wire bonding operation is effected at a step g. Upon termination of the wire bonding operation, the capillary 2 reverts to its original position. At this time, the first wire bonding process at the first bonding position at the substrate is completed, and subsequently the second wire bonding process at a second bonding position is started. As shown in FIG. 4, the first and second bonding positions are, for example, the locations of chips 27 on substrate 26. The capillary 2 continues to be lowered at the high velocity till it reaches the height h1 at steps h and i. A signal is transmitted to the driving motor 7 at a step j, thereby rotating the driving motor 7 at the low speed. Then, the capillary 2 is descended at the low velocity. A step k is to check the output signal of the amplitude detecting circuit 9. If the amplitude of the capillary 2 is less than the predetermined value, the top of the capillary 2 may be deemed to contact the bonding face. Stored in the RAM 11 is the data indicating a height h2 at which the capillary top is brought into contact with the bonding face in a step 1. The wire bonding operation is performed in a step m. After the wire bonding operation has been completed, the capillary 2 returns to the original position. A step n is to check whether the wire bonding operation has been entirely finished or not. If not, the process comes back to the step j. Whereas if finished, all the operations come to an end.

The wire bonding operation is thus repeated. In the meantime, the subsequent bonding operation is effected by lowering the capillary on the basis of the data indicating a height at which the capillary top contacts the bonding face during the previous bonding operation. Hence, even if a large warp can be seen in the substrate, the capillary is lowered at the high velocity until it reaches a position in close proximity to the bonding face.

Although the illustrative embodiment of the present invention has been described in detail with reference to the accompanying drawings, it is to be understood that the invention is not limited to this precise embodiment. Various changes or modifications may be effected therein by one skilled in the art without departing from the scope or spirit of the invention.

What is claimed is:

1. A wire bonding device including:
   a capillary means for causing a wire to make press-contact with a bonding face at at least a first bonding position and a second bonding position thereof;
   a driving motor means for raising and lowering said capillary;
   a storage means for storing capillary contact data indicating a height of said capillary relative to said bonding face at which said capillary comes in contact with said bonding face at said first bonding position; and
   a control means, responsive to said data stored in said storage means, for causing said capillary to be lowered at said second bonding position at a first predetermined velocity down to said height of said capillary relative to said bonding face at which said capillary contacts said bonding face at said first bonding position, and subsequently, if said capillary is not in contact with said bonding face at said second bonding position, for lowering said capillary at a second predetermined velocity which is lower than said first predetermined velocity until said capillary makes contact with said bonding face at said second bonding position.

2. A wire bonding device including:
   a capillary means for causing a wire to make press-contact with a bonding face at at least a first bonding position and a second bonding position;
   a driving motor means for raising and lowering said capillary;
   a storage means for storing capillary contact data indicating a height of said capillary with respect to a reference height at which said capillary makes contact with said bonding face; and
   control means, responsive to said data stored in said storage means, for causing said capillary to be lowered at said second bonding position at a first predetermined velocity down to said height of said capillary relative to said reference height at which said capillary contacts said bonding face at said first bonding position, and subsequently, if said capillary is not in contact with said bonding face at said second bonding position, for lowering said capillary at a second predetermined velocity which is lower than said first predetermined velocity until said capillary impinges upon said bonding face at said second bonding position.

3. The wire bonding device as set forth in claim 2, wherein said capillary is mounted through the intermediary of a spring to a capillary support body.

4. The wire bonding device as set forth in claim 2, wherein a cam and a pair of arms, extending from said capillary support body, for seizing said cam, cooperate to drive said capillary so as to raise and lower said capillary.

5. A wire bonding device including:
   a capillary means for causing a wire to make press-contact with a bonding face;
   a driving motor means for raising and lowering said capillary;
   a storage means for storing first data indicating a height above said bonding face of said capillary with respect to a reference height; and
   a control means, responsive to said data stored in said storage means, for causing said capillary to be lowered at a first predetermined velocity down to said height corresponding to the first data stored in said storage means and for subsequently causing said capillary to be lowered at a second predetermined velocity which is lower than said first predetermined velocity until said capillary contacts said bonding face, and said storage means stores second data representing a height of said capillary at which said capillary makes contact with said bonding face at a first bonding position.

6. A wire bonding device comprising:
   a capillary means for causing a wire to make press contact with a bonding face at each of successive bonding positions;
   a driving motor for raising and lowering said capillary at said bonding positions;
   a storage means for storing capillary contact data indicating a height of said capillary relative to said bonding face at which said capillary comes in contact with said bonding face at said successive bonding positions; and
   a control means, responsive to said data stored in said storage means, for causing said capillary to be lowered at a particular one of said successive bonding positions at a predetermined first velocity down to a height of said capillary relative to said bonding face at which said capillary contacts said bonding face at an immediately preceding one of said bonding positions, and subsequently, if said capillary is not in contact with said bonding face at said particular one of said bonding positions, for lowering said capillary at a second predetermined velocity which is lower than said first predetermined velocity until said capillary impinges upon said bonding face at said particular one of said bonding positions.

* * * * *